(12) United States Patent
Solar et al.

(10) Patent No.: US 7,978,039 B2
(45) Date of Patent: Jul. 12, 2011

(54) SEMICONDUCTOR MODULE FOR CONNECTING TO A TRANSFORMER WINDING, AND TRANSFORMER ARRANGEMENT

(75) Inventors: Anton Solar, Zelezniki (SI); Thomas Klinger, Breuberg (DE); Beno Klopcic, Ljubljana (SI); Rado Lisjak, Ljubljana (SI)

(73) Assignee: Robert Bosch GmbH, Stuttgart (DE)

( * ) Notice: Subject to any disclaimer, the term of this patent is extended or adjusted under 35 U.S.C. 154(b) by 51 days.

(21) Appl. No.: 12/522,299

(22) PCT Filed: Dec. 22, 2007

(86) PCT No.: PCT/EP2007/011415
§ 371 (c)(1),
(2), (4) Date: Sep. 17, 2009

(87) PCT Pub. No.: WO2008/083838
PCT Pub. Date: Jul. 17, 2008

(65) Prior Publication Data
US 2010/0156585 A1 Jun. 24, 2010

(30) Foreign Application Priority Data
Jan. 8, 2007 (DE) .......................... 10 2007 001 234

(51) Int. Cl.
*H01F 27/10* (2006.01)
*B23K 9/10* (2006.01)

(52) U.S. Cl. ............................. 336/60; 336/58; 219/116
(58) Field of Classification Search ................. 336/65, 336/67, 229
See application file for complete search history.

(56) References Cited

U.S. PATENT DOCUMENTS

| 4,571,669 | A | | 2/1986 | Tsujii et al. |
| 4,897,763 | A | | 1/1990 | Denzler |
| 5,056,214 | A | * | 10/1991 | Holt ............................. 29/602.1 |
| 5,331,536 | A | * | 7/1994 | Lane ............................. 363/126 |

FOREIGN PATENT DOCUMENTS

| DE | 2 203 032 | | 8/1973 |
| DE | 103 34 354 | | 7/2004 |
| EP | 0 302 237 | | 2/1989 |
| EP | 1 351 264 | | 10/2003 |
| EP | 1 610 350 | | 12/2005 |
| FR | 2 551 912 | | 3/1985 |
| JP | 06151211 A | * | 5/1994 |
| WO | 84/00638 | | 2/1984 |

* cited by examiner

*Primary Examiner* — Anh T Mai
(74) *Attorney, Agent, or Firm* — Michael J. Striker

(57) ABSTRACT

A semiconductor module (500) for connecting to a transformer winding (132, 133; 408; 409) includes a semiconductor component (501) that is disk-shaped and disposed between two contact plates (502). One of the contact plates (502) is acted upon using a cooling fluid on its side facing away from the semiconductor component (501).

16 Claims, 4 Drawing Sheets

SEMICONDUCTOR MODULE FOR CONNECTING TO A TRANSFORMER WINDING, AND TRANSFORMER ARRANGEMENT

BACKGROUND OF THE INVENTION

The present invention relates to a semiconductor module for connecting to a transformer winding, and a transformer arrangement that includes a primary winding and a secondary winding comprising a downstream output rectifier arrangement.

Although the present invention is described below essentially with reference to resistance welding systems, it is not limited to an application of this type.

In the case of known transformer arrangements, in particular welding transformer arrangements for resistance welding systems that must provide a relatively high power output, there is a need to adequately cool the electrical components of the secondary/output circuit in particular. It is known, for example, to use reshaped copper pipes as the secondary winding, and to conduct a cooling fluid or a cooling medium through the copper pipe during operation in order to adequately cool the winding. In order to improve the weak mechanical strength of this design, the copper pipes are typically welded to carrier components, e.g., the surfaces, in order to connect the winding. However, heat is added to the material in the welding process, which negatively affects the mechanical properties of the material and may also cause areas to oxidize; these areas must then be cleaned, which is a time-consuming process.

Adequate cooling is also required in the region of the output rectifier due to the relatively high power loss at the rectifier diodes. Known solutions, according to which the rectifier diodes are cooled using cooling bodies, have the disadvantage that the heat dissipation and, therefore, the power output of the transformer arrangement is indirectly limited by the relatively small cooling surfaces. As an improvement, it is proposed in DE 103 34 354 A1 to provide a liquid cooler for power semiconductors, in the case of which two mutually electrically insulated contact members—between which the power semiconductor element is situated—include a groove on their inner surfaces which face the semiconductor component; the groove is open toward the power semiconductor element and is used as the cooling duct. In this solution, the power semiconductor is in direct contact with the cooling medium, which may result in corrosion taking place, and which results in the need for additional sealing. In addition, punctiform areas where a great deal more heat forms ("hot spots") are difficult to cool if they are located outside of the direct contact area between the semiconductor and the cooling medium.

The conventional placement and orientation of the rectifier diode plane in the main direction of flow also make cooling difficult due to the poor access, and they result in a relatively expensive design, since expensive flexible connectors, such as laminated strips, are required.

SUMMARY OF THE INVENTION

The object of the present invention, therefore, is to provide a semiconductor module for connecting to a transformer winding, and a transformer arrangement, which may be cooled more easily and effectively, and which have a robust and stable yet economical design.

The semiconductor module according to the present invention is suited for connection to a transformer winding, in particular a welding transformer winding; in this case, a semiconductor component that is disk-shaped in particular is located between two contact plates, it being possible to act on at least one contact plate using a cooling fluid on its side facing away from the semiconductor component.

Via the measure according to the present invention, effective cooling of the semiconductor component may be attained without the semiconductor component being in direct contact with the cooling fluid. The contact plate is cooled by the cooling fluid and helps to protect the semiconductor component from corrosion in particular; it also ensures even cooling of the semiconductor component, since a preferred contact plate material such as copper or aluminum has a higher thermal conductivity than does the semiconductor material which is typically silicon.

As a result, the "hot spots" described above may be cooled more effectively. The contact plate functions simultaneously as a current conduction contact and a cooling surface. Since there is no direct contact between the semiconductor component and the cooling fluid, the sealing may be simplified, since, in particular when a defect occurs, only the semiconductor component between the contact plates needs to be replaced, and there is no need to access the sealing material. It is advantageous to conduct the cooling fluid through cooling ducts on the side of the contact plate facing away from the semiconductor component; the surface area between the cooling fluid and the contact plate in the region of the semiconductor component should be as large as possible. At the same time, the configuration and placement of the ducts should have minimal influence on the uniformity of the current density through the semiconductor component. In addition, in designing the ducts, care should be taken to attain a minimal drop in pressure when the cooling fluid flows through the ducts; this may be attained, e.g., by using the largest possible duct cross section and parallel branches.

It is advantageous when at least one contact plate is pressed against the semiconductor component using a spring force. A specifiable, floating fixation of the semiconductor component may therefore be attained, thereby ensuring, in particular, that the clamping forces required by the manufacturer for certain semiconductor components, e.g., diodes, that must be kept as still as possible despite temperature-induced expansions are provided, and thereby ensuring that the pressure applied to the semiconductor component is as uniform as possible. It is therefore possible to ensure that there is minimal resistance between the semiconductor component and the contact plates, that the current density through the semiconductor component is as uniform as possible, and that the semiconductor component is cooled evenly and across its surface area via the contact plates.

Advantageously, the semiconductor assembly includes two connecting elements which include at least one cavity; each of the connecting elements is connected to one of the contact plates, and the at least one cavity is designed to receive a cooling fluid. It is therefore possible to attain an extremely compact and robust design in which only a few stable components are required in order to attain a closed current conduction and cooling functionality.

It is particularly preferable for the semiconductor component to be designed as a disk-shaped rectifier diode. Effective cooling is required in particular for rectifier diodes at which output is typically relatively great, particularly in welding applications, and this is achieved using the embodiment described.

A transformer arrangement according to the present invention, in particular a welding transformer arrangement, includes a primary winding and a secondary winding comprising a downstream output rectifier arrangement. The output rectifier arrangement includes at least one semiconductor module according to the present invention, which is designed as a rectifier assembly which includes a disk-shaped rectifier diode as the semiconductor component.

By using a semiconductor module according to the present invention in a transformer arrangement, it is possible to greatly simplify the design and cooling of a transformer arrangement, since a great deal of heat develops at the rectifier diodes in particular in a welding transformer arrangement. For the rest, reference is made explicitly to the advantages described in conjunction with the semiconductor module according to the present invention.

It is particularly preferred when the main direction of flow from the secondary winding to the rectifier assembly is essentially perpendicular to the main extension plane of the disk-shaped rectifier diode. In this case, the rectifier diode or the rectifier assembly may be connected directly to the secondary winding or a related carrier component, thereby making it possible to avoid the use of expensive current connections such as a laminated strip. In addition, this design reduces the amount of installation space required. The transformer arrangement may be made smaller in size and manufactured more economically.

In a particularly preferred embodiment, the secondary winding includes at least one winding element which is used to conduct current as a component of the coil winding. The winding element includes fastening means for fastening the winding element to a carrier component, and preferably at least one interior cavity or a cavity formed in its interior which is used to receive a cooling fluid. As the carrier component, a connecting component in particular, e.g., of a rectifier assembly, may be provided inside a transformer. The solution described results in good cooling and a secure and robust means for fastening the winding element, without the occurrence of any material-altering or material-influencing side effects. The cooling fluid, in particular water, may circulate inside the winding element and thereby easily dissipate the heat that is produced. Using the fastening means provided, it is possible to fasten the winding element to a carrier component without the need to add heat, as is the case, e.g., in a welding or soldering procedure. In addition, the design does not need to be cooled or cleaned after assembly.

The fastening means are advantageously designed as threaded fastening means, in particular as a threaded hole. As a result, the winding element may be easily connected in a fixed manner to the carrier component; it may also be designed to be removable, e.g., for repair or maintenance, in order to prevent the addition of heat. Due to the threaded connection, it is possible to prevent more complex and, therefore, more expensive manufacturing and assembly methods.

According to a particularly preferred embodiment, the winding element is E-shaped in design and includes a back and three legs. It is understood that a C-shaped design or any other type of design is also possible. In the case of an E-shaped design, the winding element may be designed to be particularly robust, and it may be connected to the carrier component, e.g., to the three legs, in a particularly stable manner. In the case of an E-shaped design, there are two openings between the three legs, which may be filled, e.g., with an iron core. Due to the sizing, the use of an E-shaped design also guarantees that the impedance of the winding element will be low in a medium frequency range which occurs in the case of resistance welding transformers in particular. Due to its solid form, an E-shaped winding element may be easily fastened to the remaining structure, e.g., using screws, thereby simplifying and reducing the costs of assembly as compared to known systems in which assembly is carried out using brazing or welding.

Advantageously, the winding element is made of a solid, in particular one-pieced, material element. This may be, in particular, a material block or a material sheet. The cavity and/or the cooling lines may be bored or milled in the material element; openings that exist only for reasons of manufacture and that are not needed for the subsequent cooling circuit may be sealed using a suitable sealing material. Copper or aluminium are particularly suited for use as the material, since they have low electrical resistance and high thermal conductivity.

It is expedient when the at least one winding element is fastened to the output rectifier arrangement using a threaded connection in particular. Additional lines for conducting current may be advantageously eliminated by connecting the winding element and, therefore, the secondary winding to the output rectifier arrangement. A threaded connection makes the attachment particularly stable, and it may be detached. In all, manufacturing and assembly costs may be reduced as a result.

According to a further preferred embodiment, at least one cavity of the at least one winding element is connected to at least one cavity of the at least one rectifier assembly. It is therefore possible to form a continuous cooling circuit, which greatly simplifies the conduction of cooling fluid.

Advantageously, the primary winding includes at least one self-supporting coil element in which a strip-type line is guided in two connected, adjacently situated, oppositely wound windings. Due to the self-supporting design, it is possible to eliminate a bobbin or winding assembly. As such, it is possible to attain a higher space factor and a larger line cross section. In addition, it is easier to cool the coil element, since it is more adaptable to the existing structure. Finally, the manufacturing costs are lowered.

It is advantageous to design the cross section of the strip-type line in such a manner that the self-supporting coil element has a low impedance at medium frequencies. The coil element may therefore be advantageously used for resistance welding transformers. For example, a cross section of approximately 1 mm×8 mm may be used with approximately 9 to 10 turns per oppositely wound winding.

In a particularly preferred embodiment, the secondary winding includes four winding elements, and/or the output rectifier arrangement includes two rectifier assemblies, and/or the primary winding includes six self-supporting coil elements. It is therefore possible to create a medium-frequency welding transformer arrangement that is particularly robust in design, easy to assemble, and has good coolability.

It is particularly preferrable for the secondary winding to hold—via the winding elements—an iron core which is enclosed by the primary winding, and to be screwed onto the output rectifier arrangement. In this manner, the entire transformer arrangement may be assembled using only a few screws, and without using a welding or soldering procedure. The output rectifier arrangement supports the secondary winding which, in turn, holds the iron core on which the primary winding is installed. The entire structure of the transformer may be installed using threaded connections, thereby eliminating the need to add heat and preventing a change, in particular a deterioration, of the mechanical material properties. The entire arrangement has good thermal contact within a narrow space, which improves the coolability significantly. The contact and connecting surfaces of the structure may be prepared and/or treated as needed before they are screwed together, in order to prevent oxidation of the contact surfaces which would change the electrical properties of the structure.

It is understood that the features mentioned above and which are described below may be used not only in the combination described, but also in other combinations or alone, without leaving the scope of the present invention.

The present invention is depicted schematically in the drawing with reference to an embodiment, and it is described in detail, below, with reference to the drawing.

DETAILED DESCRIPTION OF THE PREFERRED EMBODIMENTS

Figure 1:
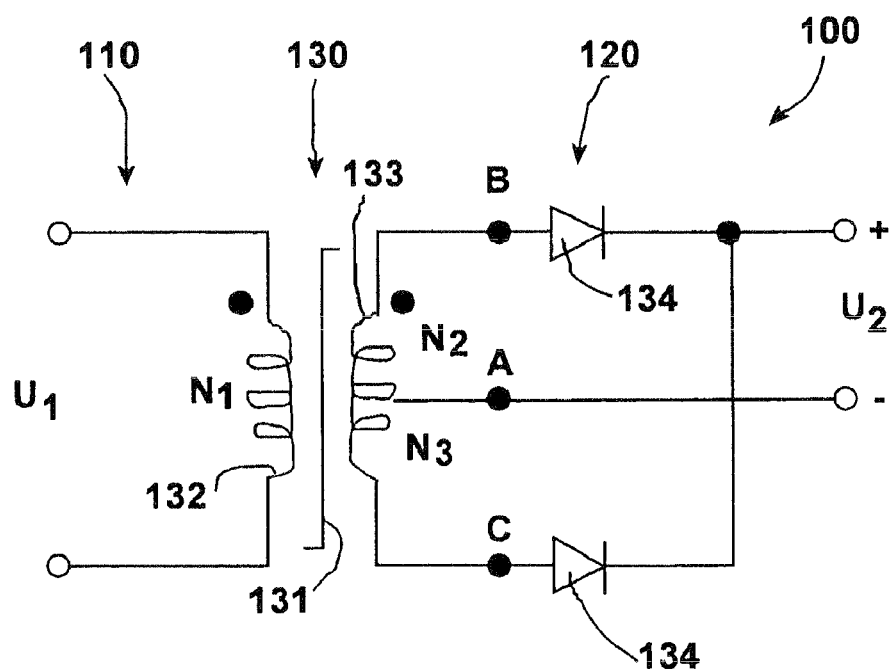
FIG. 1 shows an electrical wiring diagram of an embodiment of a transformer arrangement according to the present invention.

An electrical wiring diagram of a welding transformer arrangement is shown schematically in FIG. 1 and is labeled in entirety with reference numeral 100. Welding transformer arrangement 100 includes a primary circuit 110 and a secondary circuit 120, which are connected via a transformer 130. A primary winding 132 of transformer 130 having $N_1$ turns is connected into primary circuit 110, and a secondary winding 133 of transformer 130 having $N_2+N_3$ turns is connected into secondary circuit 120. Transformer 130 also includes a transformer core 131. Primary circuit 110 is operated using a primary voltage $U_1$ in the medium frequency range.

Secondary circuit 120 is designed as a rectifier arrangement, and it supplies transformer output voltage $U_2$. For this purpose, secondary winding 133 includes a mid-tap A which is connected to the negative output terminal (−) of arrangement 100. Starting at mid-tap A, secondary winding 133 is divided into two partial windings which have $N_2$ and $N_3$ turns and are connected to winding taps B and C, respectively. Two rectifier diodes 134 are connected downstream of winding taps B and C, the outputs of which are connected to the positive output terminal (+) of arrangement 100.

Secondary winding 133 includes, as a component, at least one preferred winding element as described in greater detail with reference to FIG. 2. Likewise, primary winding 132 advantageously includes at least one self-supporting coil element which is described in greater detail below with reference to FIG. 3.

Figure 2:
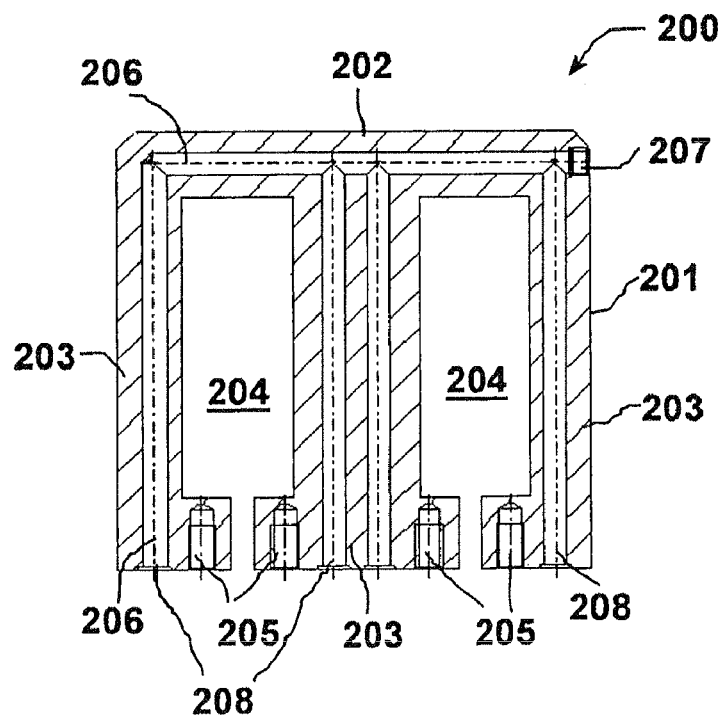
FIG. 2 shows a schematic illustration of a preferred embodiment of a winding element for use with a transformer arrangement according to the present invention.

A preferred embodiment of a winding element is shown in a flat sectional view in FIG. 2 and is labeled in entirety with reference numeral 200. Winding element 200 is composed of a solid, one-pieced copper block 201 which has an E-shaped design having a back 202 and three legs 203. Two openings 204 are situated between legs 203, into which, according to the preferred embodiment described, an iron core (indicated, e.g., by reference numeral 401 in FIG. 4) extends.

Winding element 200 includes fastening means which are designed as threaded holes 205. Using preferred threaded holes 205, it is possible to fasten winding element 200 in a robust and reliable manner to a carrier component, in particular to a component of an output rectifier arrangement. Furthermore, winding element 200 includes cavities which are designed as cylindrical holes or cooling ducts 206, and which are used to receive cooling fluid. Cylindrical holes 206 are situated in the interior of winding element 200 in such a manner that they form one continuous cooling fluid line or a cooling circuit. An opening 207 in cylindrical hole 206 that extends longitudinally inside back 202 of the winding element, and which is used to connect the cooling ducts or cylindrical holes that extend in legs 203, is sealed off toward the outside using a closing element. Further openings 208 in cooling ducts 206 are provided with circumferential recesses for receiving sealing elements, and they are used as supply and discharge lines for the cooling fluid.

Figure 3:
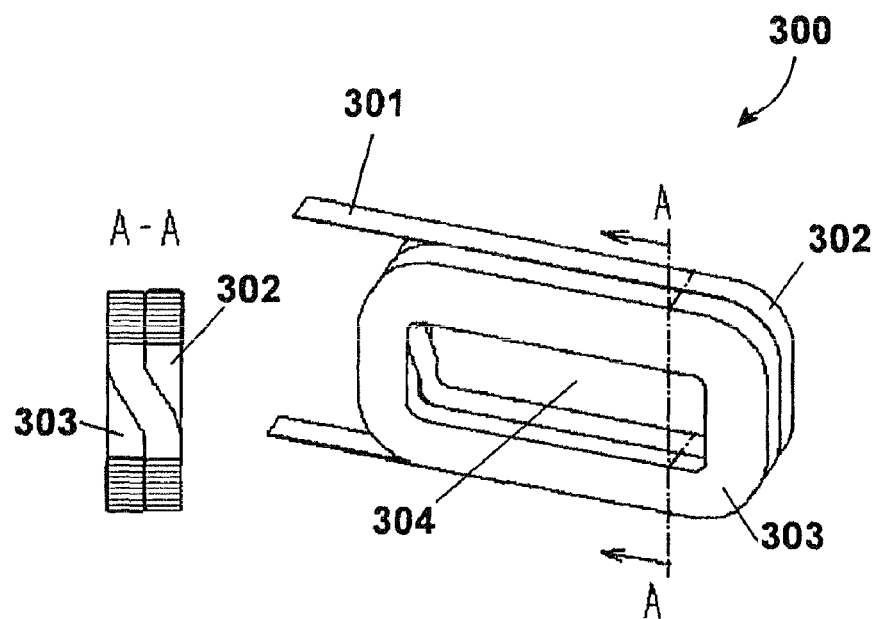
FIG. 3 shows a preferred embodiment of a self-supporting coil element for use with a transformer arrangement according to the present invention.

A preferred embodiment of a self-supporting coil element 300 is depicted schematically in a side view and in a sectional view A-A in FIG. 3, and is labeled in entirety with reference numeral 300. Coil element 300 is wound out of a rectangular conduction band 301, and it is composed of two oppositely wound, adjacently situated windings 302 and 303. The winding axis of coil element 300 extends through an opening 304, through which a transformer core is advantageously inserted. Coil element 300 is wound starting at the center of the coil; first winding 302 and second winding 303 are wound from the center toward the outside. As a result, the current connections of the particular windings are located on the outside of the particular winding and are therefore easily accessed. Nevertheless, the direction of current flow is the same in both windings, so that a magnetic field is generated in the direction of the winding axis. In the embodiment described, coil element 300 is designed to be self-supporting, thereby making it possible to eliminate a bobbin.

Figure 4:
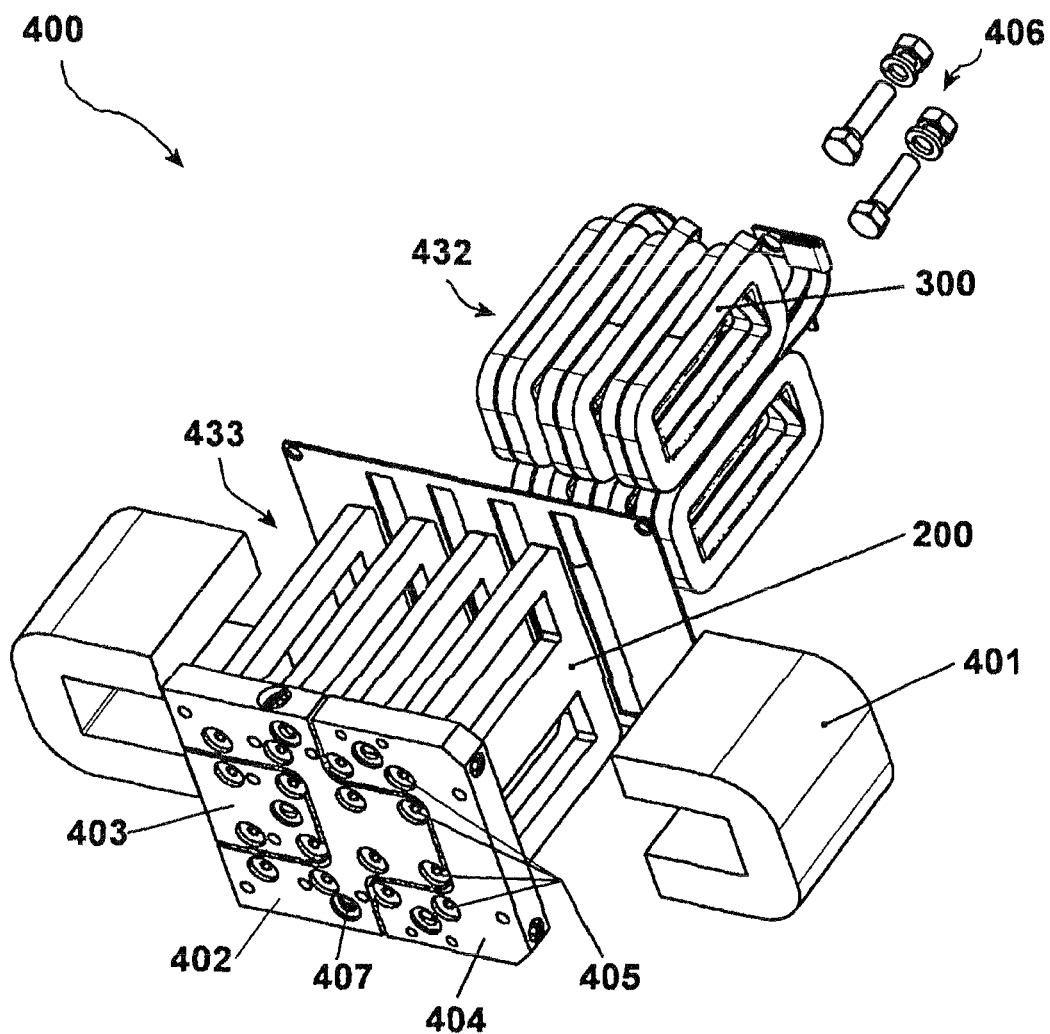
FIG. 4 shows a preferred embodiment of a winding arrangement of a transformer arrangement according to the present invention.

An exploded view of a preferred winding arrangement of a transformer is shown schematically in FIG. 4 and is labeled in entirety using reference numeral 400. Primary winding 408 of winding arrangement 400 includes six self-supporting coil elements 300 which were described in detail with reference to FIG. 3. A portion of the six coil elements 300 of primary winding 408 is connected in parallel, and a portion is connected in series. Two terminals 406 are provided for applying primary voltage $U_1$. Secondary winding 409 includes four E-shaped winding elements 200 which were described in detail with reference to FIG. 4.

To assemble winding arrangement 400, an iron core 401 is guided through openings 204 of winding elements 200 and through openings 304 of coil elements 300; coil elements 300 and winding elements 200 are situated next to one another in alternation. Winding elements 200 are fastened to carrier components which are designed as connecting pieces 402, 403, 404. In the preferred embodiment shown, winding elements 200 are screwed onto connecting pieces 402 through 404 using screws 405, not all of which are labelled with reference numerals, to ensure clarity. For this purpose, connecting pieces 402 through 404 include openings through which screws 405 are guided and screwed into threaded holes 205 in winding elements 200. Connecting pieces 402 through 404 also include openings 407 which are connected via ducts to openings 208 of winding elements 200 in order to create a cooling circuit for the cooling fluid.

Connecting pieces 402 through 404 correspond to taps A, B, C shown in FIG. 1. Connecting piece 402 corresponds to mid-tap A, and connecting pieces 403, 404 correspond to winding taps B and C, respectively. Connecting pieces 402 through 404 may be part of a semiconductor arrangement or a rectifier arrangement in particular, as described, e.g., with reference to FIG. 6.

Figure 5:
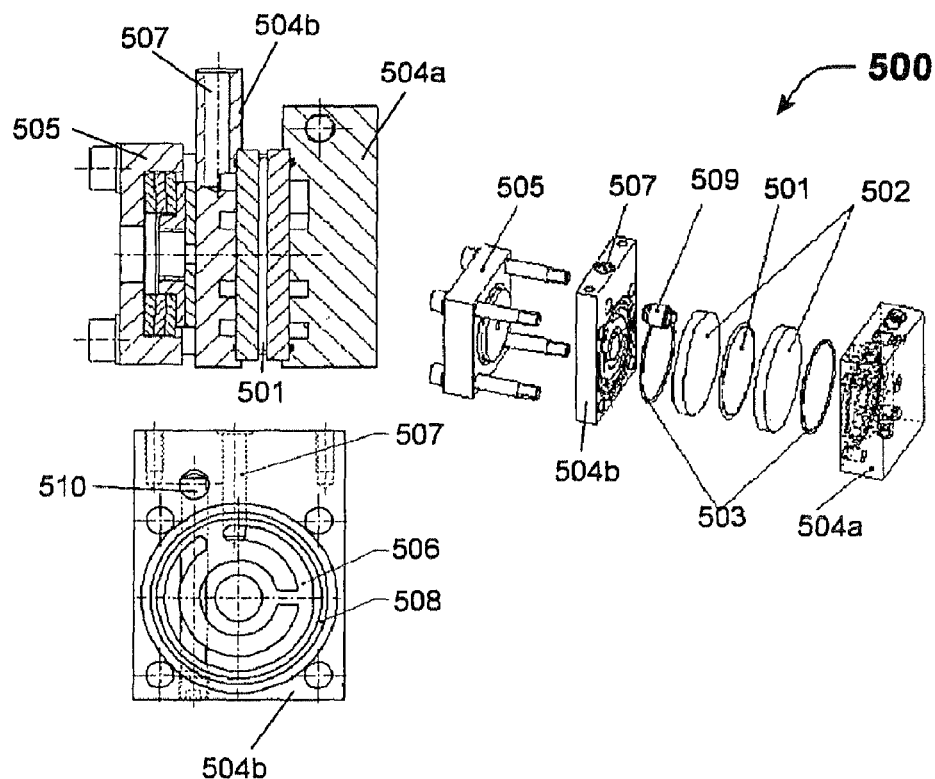
FIG. 5 shows a preferred embodiment of a rectifier assembly according to the present invention, in various views.

A preferred embodiment of a rectifier assembly is shown in various views in FIG. 5 and is labeled in entirety using reference numeral 500. A disk-shaped rectifier diode 501 which provides the electrical functionality of rectifier assembly 500 is located in the center of assembly 500. Contact plates 502 are located on both sides of diode 501. Contact plates 502 are used simultaneously as electrical contacts and as cooling surfaces for the diode. Diode 501 is therefore situated between two cooling bodies which are connected to a cooling fluid which preferably flows through cooling ducts and cooling lines. Sealing rings 503 are located on the sides of contact plates 502 facing away from diode 501 in order to prevent the cooling fluid from escaping. Sealing rings 503 are situated in associated grooves 508 which are milled in connecting elements 504a, 504b.

Connecting element 504b includes a bored inlet/outlet 507 for the cooling fluid which may reach a cavity designed as a cooling line or cooling duct 506 and circulate there. Cooling duct 506 is manufactured such that the surface between the cooling fluid and contact plate 502 is as large as possible in the region of the mounting surface of the diode, and, simultaneously, such that the distribution of the ducts has minimal influence on the uniformity of the current density through the diode. When the cooling fluid flows through the connecting element, the pressure drop is minimal, since the duct cross section is designed to be as large as possible and parallel branches are provided. The cooling fluid exits connecting element 504b through an opening 510 that has been bored and is closed on the underside of connecting element 504b. From opening 510, the cooling fluid flows via a connecting element 509 into connecting element 504a which is designed similar to connecting element 504b and also includes cooling ducts for receiving and conducting the cooling fluid. The cooling fluid flows through connecting element 504a and reaches connected winding elements 200 via further cavities and ducts provided for this purpose.

Rectifier assembly 500 also includes a fastening and spring element 505 which is used to secure assembly 500 and act on the components using a specifiable amount of spring force. It is therefore ensured that a specifiable, floating fixation exists, using which a clamping force specified by the diode manufacturer for rectifier diode 501 may be provided; it is therefore also provided that the pressure on diode 501 is as uniform as possible, and therefore, that the current density through the diode is as uniform as possible.

Figure 6:
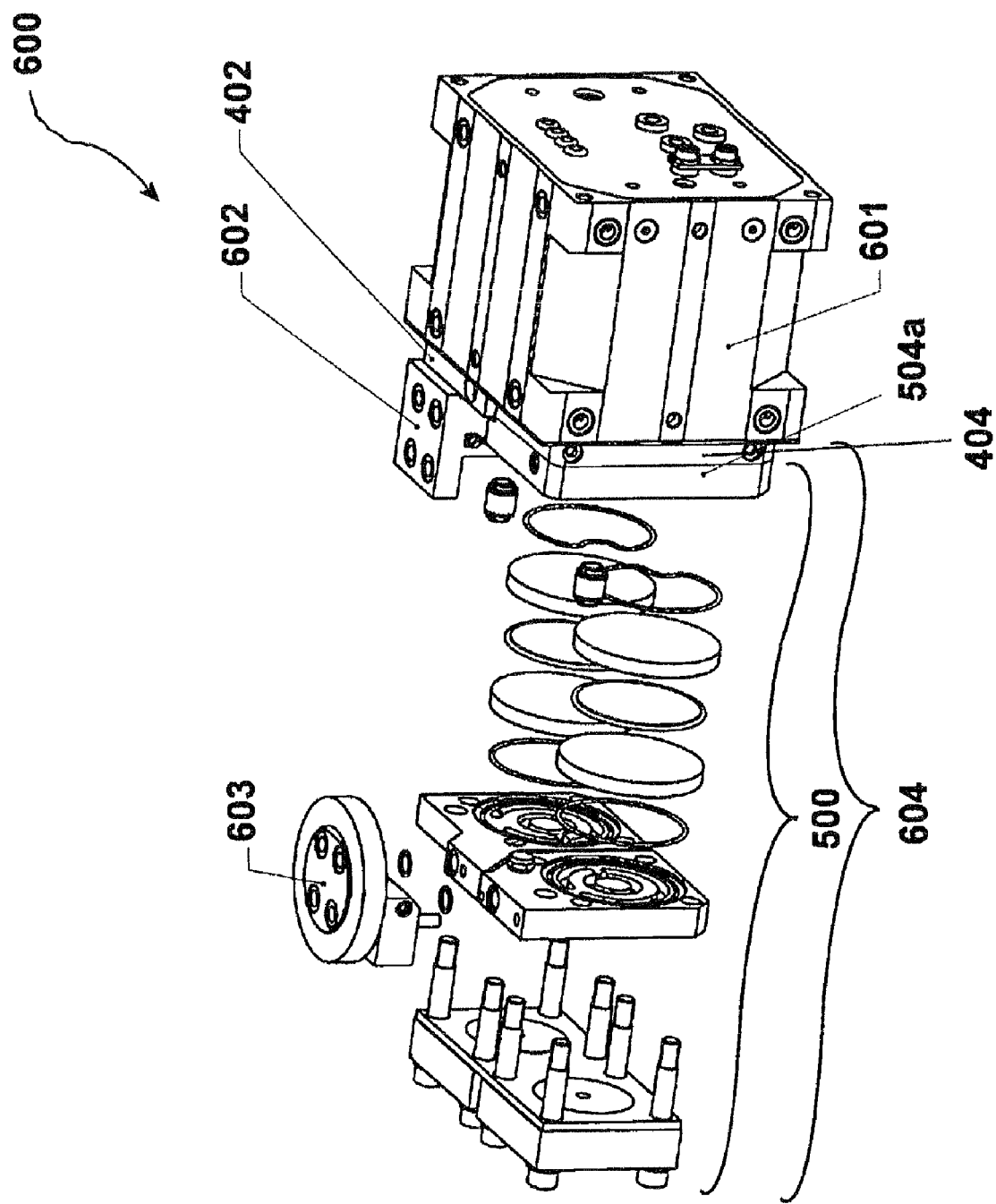
FIG. 6 shows an exploded view of a preferred embodiment of a transformer arrangement according to the present invention.

A preferred embodiment of a welding transformer arrangement is shown in a dissected view in FIG. 6, and is labelled in entirety with reference numeral 600. Transformer arrangement 600 includes two essentially identically designed rectifier assemblies 500, each of which is connected to connecting pieces 403 and 404 of a winding arrangement 400 on the outside of connecting element 504a shown on the right, as viewed in FIG. 5. As a result, the main direction of flow from the secondary winding to the rectifier assembly, which extends essentially from the top to the bottom in FIG. 6, is essentially perpendicular to the main extension plane of the disk-shaped rectifier diode, thereby making it possible to connect rectifier assemblies 500 directly to the secondary winding via connecting pieces 403, 404 without the use of additional, expensive current conduction strips. The two connecting elements 504b of the two rectifier assemblies are electrically connected to one another and are the positive outlet of the transformer assembly.

Transformer housing 601 is realized as a column-shaped hollow body, as described in greater detail, e.g., in EP 1 584 404 A1. The electrical connections for the primary voltage are shown on the top outer side of transformer housing 601 in FIG. 6. Winding arrangement 400 is situated inside transformer housing 601 as shown in FIG. 4. Winding arrangement 400 is situated almost completely inside housing 601, with the result that only connecting pieces 404 and 402 are visible on the outside.

Connecting piece 402 is mid-tap A of the secondary winding, and it is connected to a connection plate 602 which is the negative output terminal of transformer 600. Connecting pieces 404 (visible) and 403 (not visible) are each connected to a rectifier assembly 500, as explained in greater detail, above, with reference to FIG. 5. The two connecting elements 504b of the two rectifier assemblies 500 are connected to a connection plate 603 which is the positive output terminal of transformer 600. Connecting pieces 402 through 404, together with the two rectifier assemblies 500, and optionally, connection plates 602, 603, form one output rectifier assembly 604.

Entire transformer assembly 600 including output rectifier assembly 604 is advantageously assembled using threaded connections, which results in considerable advantages in terms of manufacture, in particular in terms of the time involved, as compared with conventional welded structures. In the case of welded structures, once the welding procedure is completed, the welded structure must be cooled, oxidized layers must be removed, and the surface must be post-treated. In addition, heating the structures to high temperatures changes the mechanical properties of the copper alloy of which the structure is preferably composed. The contact and connecting surfaces of the structure are prepared and/or treated as needed before they are screwed together, in order to prevent oxidation of the contact surfaces which would change the electrical properties of the structure.

It is understood that only particularly preferred embodiments of the present invention are depicted in the figures shown. Other embodiments are also feasible within the scope of the present invention.

| List of reference numerals | |
|---|---|
| 100 | Transformer arrangement |
| 110 | Primary circuit |
| 120 | Secondary circuit |
| 130 | Transformer |
| 131 | Transformer core |
| 132 | Primary winding |
| 133 | Secondary winding |
| 200 | Winding element |
| 201 | Copper block |
| 202 | Back |
| 203 | Leg |
| 204 | Opening |
| 205 | Threaded hole |
| 206 | Cooling duct |
| 207 | Opening |
| 208 | Opening |
| 300 | Coil element |
| 302, 303 | Winding |
| 400 | Winding arrangement |
| 401 | Iron core |
| 402, 403, 404 | Connecting piece |
| 405 | Screw |
| 406 | Connecting clamp |
| 407 | Opening |
| 408 | Primary winding |
| 409 | Secondary winding |
| 500 | Rectifier assembly |

-continued

| List of reference numerals | |
|---|---|
| 501 | Rectifier diode |
| 502 | Contact plate |
| 503 | Sealing ring |
| 504a, 504b | Connecting element |
| 506 | Cooling duct |
| 507 | Inlet/outlet |
| 508 | Groove |
| 509 | Connecting element |
| 510 | Opening |
| 600 | Welding transformer arrangement |
| 601 | Transformer housing |
| 602 | Connection plate (−) |
| 603 | Connection plate (+) |
| 604 | Output rectifier assembly |

What is claimed is:

1. A semiconductor module (500) for connecting to a welding transformer winding (132, 133; 408; 409), comprising:
two contact plates (502);
a disk-shaped semiconductor component (501) located between the two contact plates (502), wherein at least one of said contact plates (502) is indirectly acted upon using a cooling fluid on a side facing away from the semiconductor component (501), such that the semiconductor component is not in direct contact with the cooling fluid, wherein said at least one contact plate includes a plurality of cooling ducts disposed on the side of the at least one contact plate facing away from the semiconductor component for conducting said cooling fluid.

2. The semiconductor module (500) as recited in claim 1, wherein at least one contact plate (502) is pressed against the semiconductor component (501) using a spring force.

3. The semiconductor module (500) as recited in claim 1, further including two connecting elements (504a, 504b) which include at least one cavity (506, 507, 510) and each of which is connected to one of the contact plates (502), wherein the at least one cavity (506, 507, 510) is designed to receive the cooling fluid.

4. The semiconductor module (500) as recited in claim 1, wherein the semiconductor component is designed as a disk-shaped rectifier diode (501).

5. A welding transformer arrangement (100; 600), comprising:
a primary winding (132; 408) and a secondary winding (133; 409) which includes a downstream output rectifier arrangement (604), wherein the output rectifier assembly (604) includes at least one semiconductor module said at least one semiconductor module comprising two contact plates (502); a disk-shaped semiconductor component (501) located between the two contact plates (502), wherein at least one of said contact plates (502) is indirectly acted upon using a cooling fluid on a side facing away from the semiconductor component (501), such that the semiconductor component is not in direct contact with the cooling fluid, wherein said at least one contact plate includes a plurality of cooling ducts disposed on the side of the at least one contact plate facing away from the semiconductor component for conducting said cooling fluid, wherein the semiconductor component is designed as a disk-shaped rectifier diode (501) and which is designed as a rectifier assembly (500).

6. The transformer arrangement (100; 600) as recited in claim 5, wherein the main direction of flow from the secondary winding (133; 409) to the rectifier assembly (500) is essentially perpendicular to the main extension plane of the disk-shaped rectifier diode (501).

7. The transformer arrangement (100; 600) as recited in claim 5, wherein the secondary winding (133; 409) includes at least one winding element (200) having fastening means (205) for fastening the same to a carrier component (402, 403, 404).

8. The transformer arrangement (100; 600) as recited in claim 7, wherein the at least one winding element (200) includes at least one cavity (206) formed in its interior for receiving a cooling fluid.

9. The transformer arrangement (100; 600) as recited in claim 7, wherein the fastening means (205) are designed as threaded fastening means, in particular as a threaded hole.

10. The transformer arrangement (200) as recited in claim 7, wherein the at least one winding element (200) is designed in the shape of an "E" having a back (202) and three legs (203), and/or it is made of a solid, one-pieced, material element (201).

11. The transformer arrangement (100; 600) as recited claim 7, wherein the at least one winding element (200) is fastened to the output rectifier arrangement (604) using a threaded connection (205; 405).

12. The transformer arrangement (100; 600) as recited in claim 7, wherein at least one cavity (206) of the at least one winding element (200) and at least one cavity (506, 507, 510) of the at least one rectifier assembly (500) are interconnected.

13. The transformer arrangement (100; 600) as recited in claim 5, wherein the primary winding (132; 408) includes at least one self-supporting coil element (300) in which a strip-type line (301) is guided in two connected, adjacently situated, oppositely wound windings (302, 303).

14. The transformer arrangement (100; 600) as recited in claim 13, wherein the cross section of the strip-type line (301) is designed such that the self-supporting coil element (300) has a low impedance at medium frequencies.

15. The transformer arrangement (100; 600) as recited in claim 5, wherein the secondary winding (133; 409) includes four winding elements (200) and/or the output rectifier arrangement (604) includes two rectifier assemblies (500) and/or the primary winding (132; 408) includes six self-supporting coil elements (300).

16. The transformer arrangement (100; 600) as recited in claim 15, wherein the secondary winding (133; 409) holds—via the winding elements (200)—an iron core (401) which is enclosed by the primary winding (132; 408), and is screwed onto the output rectifier assembly (604).

* * * * *